(12) United States Patent
Gradinger et al.

(10) Patent No.: US 11,706,906 B2
(45) Date of Patent: Jul. 18, 2023

(54) SUBSEA POWER MODULE

(71) Applicant: ABB Schweiz AG, Baden (CH)

(72) Inventors: Thomas Gradinger, Aarau Rohr (CH); Tor Laneryd, Enköping (SE)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 17/997,487

(22) PCT Filed: Apr. 22, 2021

(86) PCT No.: PCT/EP2021/060555
§ 371 (c)(1),
(2) Date: Oct. 28, 2022

(87) PCT Pub. No.: WO2021/224016
PCT Pub. Date: Nov. 11, 2021

(65) Prior Publication Data
US 2023/0128508 A1    Apr. 27, 2023

(30) Foreign Application Priority Data

May 4, 2020    (EP) ..................................... 20172730

(51) Int. Cl.
*H05K 7/20* (2006.01)
*F28D 1/02* (2006.01)

(52) U.S. Cl.
CPC ....... *H05K 7/20927* (2013.01); *F28D 1/0206* (2013.01)

(58) Field of Classification Search
None
See application file for complete search history.

(56) References Cited

U.S. PATENT DOCUMENTS 10,212,849 B2 * 2/2019 Matsumoto ........ H05K 7/20272
10,455,730 B2 * 10/2019 Haj-Maharsi .......... H05K 7/202
(Continued)

FOREIGN PATENT DOCUMENTS

AU    2014347328 A1    5/2016
EP      3051243 A1    8/2016
(Continued)

OTHER PUBLICATIONS

Extended European Search Report; Application No. 20172730.2; Completed: Oct. 19, 2020; dated Oct. 29, 2020; 7 Pages.
(Continued)

*Primary Examiner* — Courtney L Smith
(74) *Attorney, Agent, or Firm* — Whitmyer IP Group LLC

(57) ABSTRACT

A subsea power module including: a tank having a tank wall provided with an outwardly protruding corrugation, a power device arranged in the tank, a dielectric liquid which fills the tank, for cooling the power device, a pump configured to circulate the dielectric liquid in the tank, wherein the pump has a pump inlet and a pump outlet, a duct arranged in the corrugation such that a chamber is formed between a tip of the corrugation and the duct, wherein the duct has a duct inlet connected to the pump outlet, and wherein the duct is provided with at least one duct outlet opening into the chamber, and a distancing structure configured to space apart an outer surface of the duct facing the tank wall and the tank wall in the corrugation, whereby gaps are formed between the duct and the tank wall in the corrugation, enabling dielectric liquid that has been discharged through the at least one duct outlet into the chamber to be squeezed out from the chamber and the corrugation, and flow towards the pump inlet.

19 Claims, 3 Drawing Sheets

(56) References Cited

U.S. PATENT DOCUMENTS

| | | | | |
|---|---|---|---|---|
| 10,624,236 B2* | 4/2020 | Inano | ............... | H05K 7/20236 |
| 10,893,629 B2* | 1/2021 | Ishinabe | ............ | H05K 7/20236 |
| 11,419,241 B2* | 8/2022 | Laneryd | ............ | H05K 7/20263 |
| 11,448,473 B2* | 9/2022 | Laneryd | ............ | H05K 7/20236 |
| 11,516,943 B2* | 11/2022 | Bilan | ............... | H05K 7/20236 |
| 2016/0247622 A1 | 8/2016 | Bjoerkhaug | | |
| 2016/0381840 A1 | 12/2016 | Peterson et al. | | |
| 2017/0064862 A1* | 3/2017 | Miyoshi | ............... | H01L 23/32 |
| 2017/0112021 A1 | 4/2017 | Gradinger et al. | | |
| 2017/0265336 A1* | 9/2017 | Ichinose | ............ | H05K 7/20772 |
| 2017/0280577 A1 | 9/2017 | Laneryd et al. | | |
| 2019/0357385 A1* | 11/2019 | Miyazaki | ............ | H05K 7/20236 |
| 2023/0032562 A1* | 2/2023 | Sweeney | ............ | H05K 7/20272 |

FOREIGN PATENT DOCUMENTS

| | | | |
|---|---|---|---|
| EP | 3389088 A1 | 10/2018 | |
| WO | 2016134948 A1 | 9/2016 | |

OTHER PUBLICATIONS

International Search Report and Written Opinion of the International Searching Authority; Application No. PCT/EP2021/060555; Completed: Jul. 23, 2021; dated Aug. 3, 2021; 12 Pages.

* cited by examiner

SUBSEA POWER MODULE

TECHNICAL FIELD

The present disclosure generally relates to subsea electrical installations, in particular to subsea power modules utilising forced cooling.

BACKGROUND

Various machinery such as pumps and compressors are employed in subsea production of oil and gas. Such machinery is powered by electric motors, which in turn are driven by power converters.

Subsea electrical equipment such as subsea power converters are advantageously enclosed in a tank filled with a dielectric liquid such as mineral oil, ester, or isoparaffin. Hence, all the electric and electronic components are immersed in the dielectric liquid, which also acts as a cooling liquid.

Natural convection of the dielectric liquid of subsea electrical equipment may in some ways be preferred because of its high reliability as no mechanical pumps are required. However, subsea electrical equipment cooled by natural convection tend to be thermally limited. There are ways to enhance the cooling performance of natural convection, but they all have their drawbacks and limitations.

A first way is to provide an external heat exchanger. However, the construction of such heat exchangers is demanding and expensive because of the marinization requirements, including tightness, corrosion resistance, and thick walls of stainless steel. In addition, external heat exchangers that protrude from the main tank bear the risk of being damaged during transport and installation.

A second way is to extend the inner surface of the tank wall to provide more heat-transfer area for the dielectric liquid by the provision of cooling fins. It is, however, not easy to provide such extensions economically and with a low thermal resistance. For example, direct connection by material bonds of cooling fins to the material surface is difficult to manufacture especially if the fin material is of high thermal conductivity. Another option is clamping of cooling fins to the tank wall. This however results in contact resistance between the heat sink and the tank wall.

It may thus be advantageous to turn to forced cooling to avoid the above disadvantages.

US20170112021 discloses an arrangement for cooling components of a subsea electric system including a tank filled with a dielectric fluid. The arrangement includes a heat exchanger located outside the tank. The heat exchanger is in fluid contact with the tank and is arranged to be in thermal contact with sea water. Flow of the dielectric fluid is by both natural and forced convection generated by a pump.

US2016/247622 discloses a subsea transformer that includes two tanks mounted one above the other.

AU 2014 347 328 discloses a sheet for exchange of heat and/or mass transfer between fluid flows, which sheet is provided with corrugations defining open channels, wherein every other open channel is a corrugated open channel, wherein a cross-section of every corrugated open channel has two channel end points, and two peaks and a valley floor between the two channel end points.

WO 2016/134948 discloses a seawater-based high resistance grounding device for a subsea transformer includes an insulated pipe mounted to the outside of the transformer so as to be exposed to seawater.

SUMMARY

In view of the above, a general object of the present disclosure is to provide a subsea power module that solves or at least mitigates the problems of the prior art.

There is hence provided a subsea power module comprising: a tank having a tank wall provided with an outwardly protruding corrugation, a power device arranged in the tank, a dielectric liquid which fills the tank, for cooling the power device, a pump configured to circulate the dielectric liquid in the tank, wherein the pump has a pump inlet and a pump outlet, a duct arranged in the corrugation such that a chamber is formed between a tip of the corrugation and the duct, wherein the duct has a duct inlet connected to the pump outlet, and wherein the duct is provided with at least one duct outlet opening into the chamber, and a distancing structure configured to space apart an outer surface of the duct facing the tank wall and the tank wall in the corrugation, whereby gaps are formed between the duct and the tank wall in the corrugation, enabling dielectric liquid that has been discharged through the at least one duct outlet into the chamber to be squeezed out from the chamber and the corrugation, and flow towards the pump inlet.

Efficient forced-convection cooling is enabled by squeezing the dielectric liquid through the narrow gaps. No surface extension such as heat sinks clamped to the tank wall are required. Accordingly, there is also no contact resistance between a surface extension such as a baseplate of a heat sink, and the tank wall. The solution is also space-saving, as it uses the space inside the corrugation without protruding substantially into the interior of the tank.

The flow of the dielectric fluid in the gaps is preferably laminar. Therefore, the heat transfer normal to the tank wall is by conduction only. Such heat transfer is efficient if the gaps are narrow, i.e. if the gaps have a small gap size s. The dielectric liquid side heat transfer coefficient $h_{dielectric-wall}$ is inversely proportional to s, i.e. $h_{dielectric-wall} \propto 1/s$. The dielectric liquid side heat transfer coefficient $h_{dielectric-wall}$ may have a unit of $W/(m^2K)$.

Flow through a narrow gap creates a lot of pressure drop. This pressure drop is made available by forced cooling, i.e. by the pump. With sufficient pressure available it is possible to obtain full advantage of narrow gaps to make the dielectric liquid side heat transfer coefficient $h_{dielectric-wall}$ large.

The dielectric liquid may have a viscosity of at least 50 mPa*s at 20° C.

The dielectric liquid may for example be a mineral oil, an ester, or an isoparaffin.

The gap size of the gaps may be such that the dielectric liquid side heat transfer coefficient $h_{dielectric-wall}$ is at least 150 $W/(m^2K)$, such as at least 200 $W/(m^2K)$, such as at least 250 $W/(m^2K)$, such as at least 300 $W/(m^2K)$.

The gap size may for example be at most 5 mm, such as at most 4 mm, such as at most 3 mm, such as at most 2 mm, such as at most 1 mm.

The subsea power module may comprise a plurality of corrugations and a plurality of ducts, each duct being arranged in a respective corrugation. Each duct and corrugation may be of the type(s) described herein. Thus, the plurality of ducts and corrugations may form a forced subsea cooling system together with the pump. The duct inlet of each duct may be connected to the pump outlet. The subsea power module may for example comprise a manifold to which the pump outlet and all the duct inlets are connected. The dielectric liquid may thus be distributed from the pump to all the ducts.

According to one embodiment the distancing structure is a liner arranged between the duct and the tank wall in the corrugation, and wherein the distancing structure has a varying thickness causing the formation of the gaps.

According to one embodiment the distancing structure is a mesh.

According to one embodiment the mesh is made of wires that cross over, forming cross-over points which define a maximum thickness of the mesh, wherein the gaps are formed between the cross-over points and the duct and/or the tank wall.

The gap size is thus obtained from the mesh and the cross-over points. It is beneficial to use a mesh because it does not require any part being positioned with a high precision.

According to one embodiment the mesh is a metal mesh.

According to one embodiment the distancing structure is formed by protrusions provided on the outer surface of the duct.

According to one embodiment the protrusions are pins or stubs.

One embodiment comprises an elastic sheet arranged between the duct and the tank wall in the corrugation. The elastic sheet ensures a snug fit even in case the shape of the duct deviates somewhat from that of the corrugation. The desired gap size may thus be ensured, and the heat transfer can thereby be made more efficient.

According to one embodiment the duct has an elastic portion configured to enable adaptation of the shape of the duct to the shape of the corrugation.

One embodiment comprises a clamping structure provided with a resilient member configured to press the duct into the corrugation. The resilient member may for example comprise a spring. The duct will thereby be firmly arranged in the corrugation. The heat transfer may thereby be made more efficient since the gap size may be maintained under pressure of the dielectric liquid passing between the duct and the tank wall in the corrugation.

The elastic portion may act like a spring, which affects the width of the duct.

The elastic portion may be a duct corrugation arranged on a side of the duct which is directed towards the interior of the tank. The duct corrugation may be arranged on a side of the duct that is located between two sides of the duct that face the tank wall in the corrugation.

One embodiment comprises a plurality of duct outlets arranged one after the other along the length of the duct in the corrugation.

According to one embodiment the duct has a longitudinal axis, and wherein the duct has a trapezoidal cross-sectional shape along the longitudinal axis.

Manufacturing tolerance requirements may thereby be lower regarding the fit of the duct in the corrugation.

The corrugation may have a shape corresponding the cross-sectional shape of the duct, to be able to receive the duct with a snug or tight fit.

According to one embodiment the duct has a vertical orientation in the tank and the duct inlet is arranged in a top portion of the duct.

According to one embodiment the power device is a power converter.

The subsea power module may be a subsea power converter or a subsea power transformer.

Generally, all terms used in the claims are to be interpreted according to their ordinary meaning in the technical field, unless explicitly defined otherwise herein. All references to "a/an/the element, apparatus, component, means, etc. are to be interpreted openly as referring to at least one instance of the element, apparatus, component, means, etc., unless explicitly stated otherwise.

BRIEF DESCRIPTION OF THE DRAWINGS

The specific embodiments of the inventive concept will now be described, by way of example, with reference to the accompanying drawings, in which.

DETAILED DESCRIPTION

The inventive concept will now be described more fully hereinafter with reference to the accompanying drawings, in which exemplifying embodiments are shown. The inventive concept may, however, be embodied in many different forms and should not be construed as limited to the embodiments set forth herein; rather, these embodiments are provided by way of example so that this disclosure will be thorough and complete, and will fully convey the scope of the inventive concept to those skilled in the art. Like numbers refer to like elements throughout the description.

Figure 1:
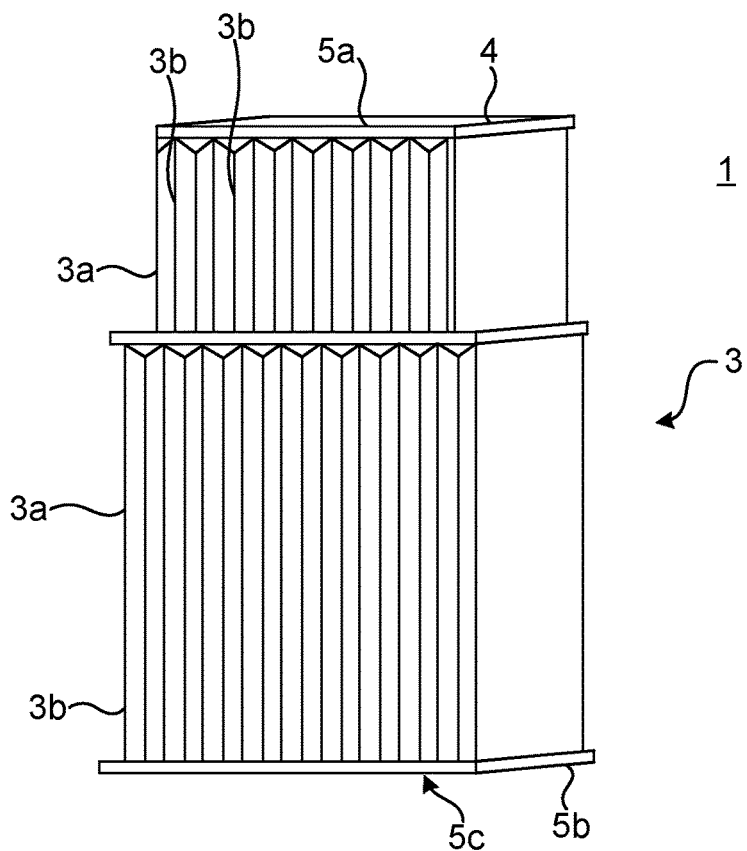
FIG. 1 is a schematic perspective view of a subsea power module.

FIG. 1 shows a perspective view of an example of a subsea power module 1. The subsea power module 1 may for example be a subsea power converter module. The subsea power module 1 may be adapted to withstand a hydrostatic pressure in the range of 10 to 100 or more bar. The subsea power module 1 is configured to be installed on the seabed as part of a subsea electrical infrastructure.

The subsea power module 1 comprises a tank 3. The tank 3 is preferably made of a metal material such as stainless steel. The tank 3 has tank walls 3a. The tank walls 3a may have a thickness that is large enough to withstand the ambient hydrostatic pressure at the seabed. Alternatively, the subsea power module 1 may comprise a pressure compensator such as a bellow. In the latter case, the tank walls 3a can be made thinner than in the former case.

The tank wall 3a is provided with a plurality of corrugations 3b. The corrugations 3b extend outwards from the subsea power module 1. The corrugations 3b are arranged in parallel with each other. The tank 3 has a top 5a formed by a top plate or structure 4 and a bottom 5b formed by a bottom plate or structure 5c. The corrugations 3b extend in a direction from the top 5a towards the bottom 5b. The corrugations 3b hence have a vertical extension when the subsea power module 1 stands on its bottom plate 5c. The corrugations 3b may be straight along their main axis of extension.

Figure 2:
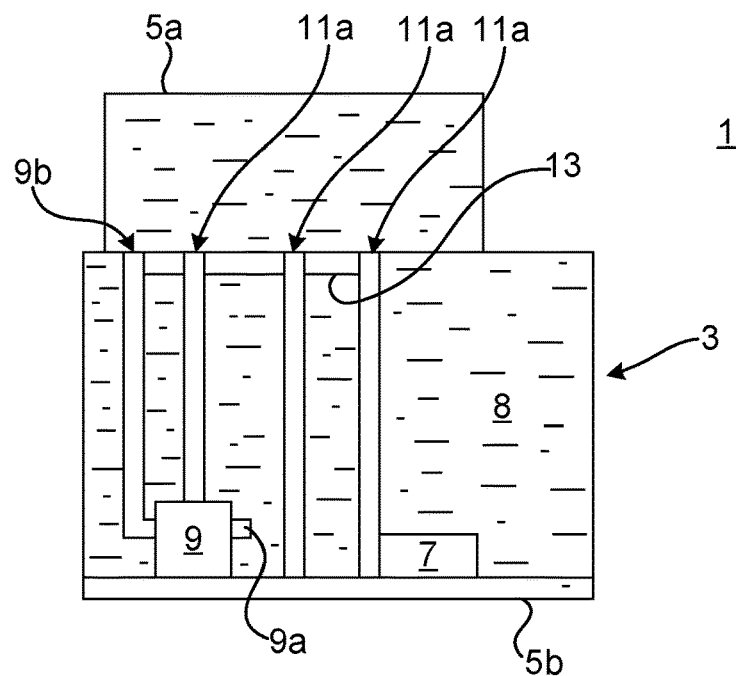
FIG. 2 schematically shows a sectional view of a subsea power module.

Turning now to FIG. 2 a schematic simplified cross-sectional view of subsea power module 1 is shown.

The subsea power module 1 comprises a power device 7. The power device 7 is arranged in the tank 3. The power device may for example be a power converter or a transformer including windings and a magnetic core.

The subsea power module 1 comprises a dielectric liquid 8. The power device 7 is immersed in the dielectric liquid 8. The dielectric liquid 8 fills the tank 3.

The subsea power module 1 comprises a pump 9. The pump 9 is configured to circulate the dielectric liquid 8 in the tank 3 by forced convection. The pump 9 comprises a pump inlet 9a and a pump outlet 9b. The pump inlet 9a is arranged to suck dielectric liquid 8 into the pump 9.

The subsea power module 1 comprises one or more ducts 11. In the following the subsea power module 1 will be exemplified with a plurality of ducts 11 although examples of subsea power modules comprising a single duct are also envisaged.

Each duct 11 has a duct inlet 11a connected to the pump outlet 9b. The ducts 11 are thus configured to be fed with the dielectric liquid 8 from the pump 9 via the pump outlet 9b. The pump 9 is configured to pump the dielectric liquid 8 into the ducts 11 via the duct inlets 11a. The ducts 11 also have one or more duct outlets for discharging the dielectric liquid 8, which will be explained in more detail in the following. In this manner, the power device 7 is cooled by forced convection by the dielectric liquid 8. In the case that only one duct outlet is provided in a duct, it may preferably be arranged midway or substantially midway along the duct, for example in a region of ⅓ to ⅔ of the total length of the duct.

The ducts 11 are arranged in a respective corrugation 3b of the tank wall 3a. The ducts 11 thus extend parallel with the corrugations 3b. The duct inlets 11a are arranged in a top portion of the ducts 11.

The subsea power module 1 may comprise a manifold 13 connected to the pump outlet 9b. The ducts 11 may be connected to the manifold 13. The duct inlets 11a may be connected to the manifold 13 for pumping the dielectric liquid 8 into the ducts 11.

Figure 3:
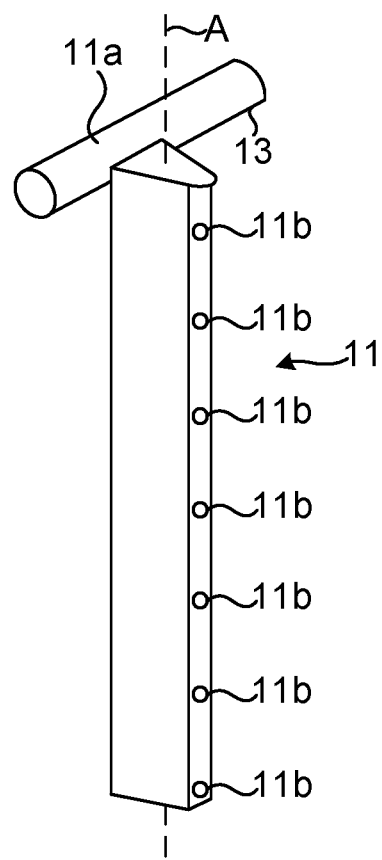
FIG. 3 is a schematic perspective view of a duct.

FIG. 3 schematically shows a perspective view of one of the ducts 11. The duct 11 is connected to the manifold 13 via its duct inlet 11a. The exemplified duct 11 is provided with a plurality of duct outlets 11b. The duct outlets 11b are distributed along the length of the duct 11. The duct outlets 11b may be arranged one after the other along a longitudinal axis A of the duct 11. The dielectric fluid 8 that has been pumped into the duct 11 via the duct inlet 11a is discharged from the duct 11 through the duct outlets 11b. The duct 11 is arranged in a corrugation 3b and thus the duct outlets 11b are configured to discharge the dielectric liquid 8 into the corrugation 3b.

Figure 4:
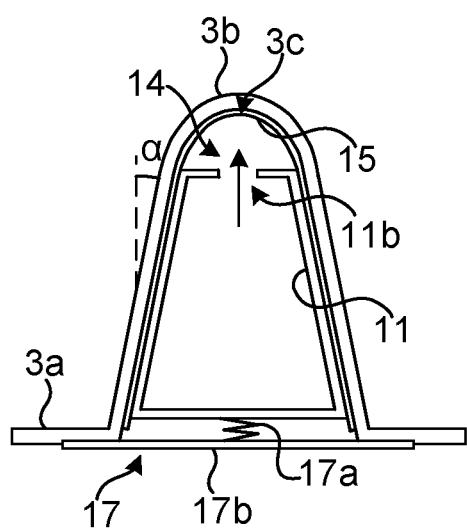
FIG. 4 is a cross-sectional view of an example of a duct arranged in a corrugation.

FIG. 4 shows a cross-sectional view of a duct 11 arranged in a corrugation 3b. The corrugation 3b may have a generally trapezoidal cross-sectional shape. The duct 11 may have a generally trapezoidal cross-sectional shape. In general, the duct 11 may have a cross-sectional shape corresponding to that of the corrugation 3b.

In cross-section, the corrugation 3b may have a tapering angle α. The corrugation 3b may taper in a direction towards its tip 3c. Preferably, the duct 11 also has a tapering angle α to obtain a snug/tight fit of the duct 11 in the corrugation 3b.

The duct 11 is arranged in the corrugation 3b such that a chamber 14 is formed between the tip 3c of the corrugation 3b. The duct 11 is spaced apart from the tip 3c, i.e. the tip of the inner tank wall 3a in the corrugation 3b. The duct 11 does hence not extend fully into the corrugation 3b. The chamber 14 thus extends in the longitudinal direction of the corrugation 3b along the extension of the duct 11. The duct outlets 11b open into the chamber 14. The dielectric liquid 8 that is discharged from the duct outlets 11b of the duct 11 hence flows into the chamber 14.

The subsea power module 1 comprises a clamping structure 17 including a resilient member 17a. The resilient member 17a is configured to press the duct 11 into the corrugation 3b and maintain the duct 11 in this position. The resilient member 17a may for example be a spring.

The clamping structure 17 may include a plate 17b fixed to the inner tank wall 3a. The resilient member 17a may be arranged between the plate 17b and the duct 11 such that the resilient member 17a can push or press the duct 11 towards the tip 3c of the corrugation 3b.

The subsea power module 1 comprises a distancing structure 15. The distancing structure 15 is configured to space apart an outer surface of the duct 11 facing the inner tank wall 3a, and the inner tank wall 3a of the corrugation 3b such that gaps are formed between the duct 11 and the tank wall 3a. The dielectric liquid 8 that has been discharged from the duct outlets 11b into the chamber 14 is thus able to be squeezed out from the chamber 14 and the corrugation 3b via the gaps. This may be achieved by providing a sufficiently high pressure with the pump 9 to enable the dielectric liquid 8 to escape the chamber 14 and the corrugation 3b through the gaps.

The gaps may for example be provided by a distancing structure 15 in the form of a liner that has varying thickness. The gaps are thus formed between the distancing structure 15 and the duct and/or the inner tank wall 3a.

In the example shown in FIG. 4, the distancing structure 15 is a liner arranged between the duct 11 and the tank wall 3a in the corrugation 3b. The distancing structure 15 may in this case for example be a mesh. The mesh may be made of metal such as stainless steel. Alternatively, the distancing structure may be formed by a plurality of protrusions on the outer surface of the duct, as will be explained with reference to FIG. 8.

Figure 5:
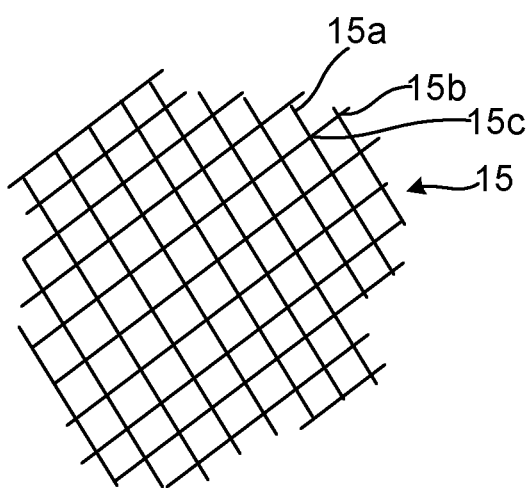
FIG. 5 schematically shows a mesh.

In the case the distancing structure 15 is a mesh, the gaps may be formed by cross-over points. FIG. 5 shows an example of a distancing structure 15 in the form of a mesh. The mesh is formed by a plurality of wires 15a and 15b that cross over. Cross-over points 15c, which are the points where the wires 15a and 15b cross each other, are thereby formed. The cross-over points 15c define a maximum thickness of the mesh. Gaps are formed between the cross-over points 15c and the duct 11 and/or between the cross-over points 15c and the inner tank wall 3a in the corrugation 3b. These gaps enable the dielectric liquid 8 to escape from the chamber 14 and the corrugation 3b when a sufficiently high pump pressure is provided by the pump 9.

Figure 6:
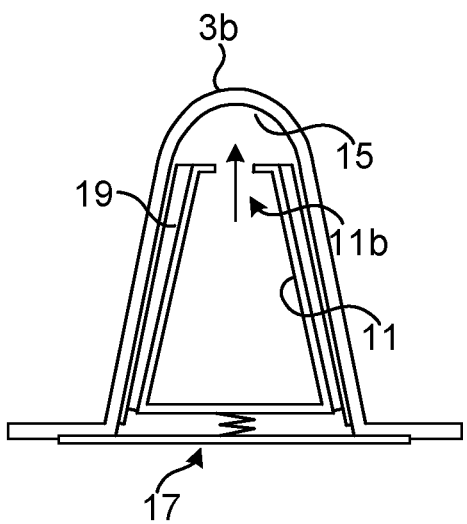
FIG. 6 is a cross-sectional view of another example of a duct arranged in a corrugation.

FIG. 6 shows an example of a subsea power module 1 that comprises an elastic sheet 19 arranged between the distancing structure 15 and the duct 11. The elastic sheet 19 has an elastic thickness depending on the pressure applied onto its main surfaces. A snug/tight fit between the outer surface of the duct 11 and the distancing structure 15, in case it is a liner, or the duct 11 and the inner tank wall 3a may thus be obtained. An essentially uniform size of the gaps may thus be obtained, in accordance with a desired dielectric liquid side heat transfer coefficient $h_{dielectric-wall}$.

Figure 7:
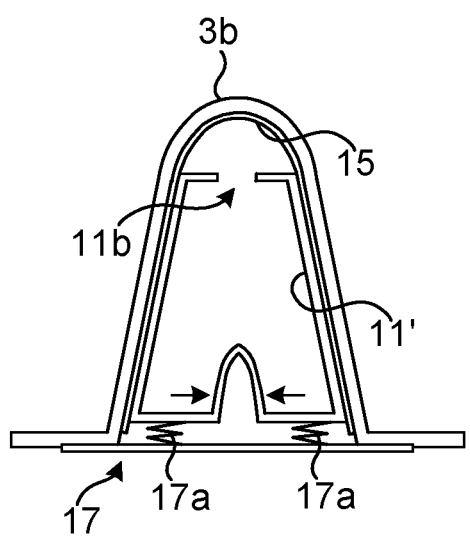
FIG. 7 is a cross-sectional view of another example of a duct arranged in a corrugation.

FIG. 7 shows another example of a duct 11'. The duct 11' is similar to the previously presented ducts 11. The duct 11' however has an elastic portion 11c. The elastic portion 11c is configured to make the duct 11' mechanically flexible. The duct 11' can thereby adapt its shape to that of the corrugation 3b to obtain a snug/tight fit between the duct 11' and the inner tank wall 3b and/or with the distancing structure 15 to obtain an essentially uniform size of the gaps. Thus, in case the tapering angle α of the corrugation and the tapering angle of the duct differ, a snug fit may still be obtained.

The elastic portion 11c may for example be a fold or duct corrugation arranged in a side of the duct 11' that is opposite to the duct outlets 11b.

Deformation of the duct 11' may thus be obtained as shown by the two facing arrows, to enable adaption of the shape of the duct 11' to that of the corrugation 3b.

In the example shown in FIG. 7, the clamping structure 17 may be provided with two resilient members 17a, arranged symmetrically on each side of the elastic portion 11c.

Figure 8:
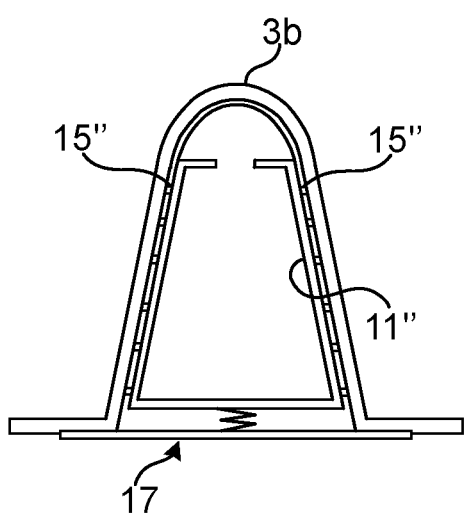
FIG. 8 is a cross-sectional view of yet another example of a duct arranged in a corrugation.

FIG. 8 shows another example of a duct 11". The duct 11" is similar to the duct 11 but instead of utilising a distancing structure in the form of a liner the distancing structure 15" is in this case formed by a plurality of protrusions arranged on the outer surface of the duct 11". The protrusions may for example be pins or studs. The gaps are formed between the protrusions, the outer surface of the duct 11" and the corrugation 3b.

The inventive concept has mainly been described above with reference to a few examples. However, as is readily appreciated by a person skilled in the art, other embodiments than the ones disclosed above are equally possible within the scope of the inventive concept, as defined by the appended claims.

The invention claimed is:

1. A subsea power module comprising:
   a tank having a tank wall provided with an outwardly protruding corrugation,
   a power device arranged in the tank,
   a dielectric liquid which fills the tank, for cooling the power device,
   a pump configured to circulate the dielectric liquid in the tank, wherein the pump has a pump inlet and a pump outlet,
   a duct arranged in the corrugation such that a chamber is formed between a tip of the corrugation and the duct,
   wherein the duct has a duct inlet connected to the pump outlet, and wherein the duct is provided with at least one duct outlet opening into the chamber, and
   a distancing structure configured to space apart an outer surface of the duct facing the tank wall and the tank wall in the corrugation, whereby gaps are formed between the duct and the tank wall in the corrugation, enabling dielectric liquid that has been discharged through the at least one duct outlet into the chamber to be forced out by the pump from the chamber and the corrugation, and flow towards the pump inlet.

2. The subsea power module as claimed in claim 1, wherein the distancing structure is a liner arranged between the duct and the tank wall in the corrugation, and wherein the distancing structure has a varying thickness causing the formation of the gaps.

3. The subsea power module as claimed in claim 1, wherein the distancing structure is a mesh.

4. The subsea power module as claimed in claim 3, wherein the mesh is made of wires that cross over, forming cross-over points which define a maximum thickness of the mesh, wherein the gaps are formed between the cross-over points and the duct and/or the tank wall.

5. The subsea power module as claimed in claim 3, wherein the mesh is a metal mesh.

6. The subsea power module as claimed in claim 1, wherein the distancing structure is formed by protrusions provided on the outer surface of the duct.

7. The subsea power module as claimed in claim 6, wherein the protrusions are pins or stubs.

8. The subsea power module of claim 1, comprising an elastic sheet arranged between the duct and the tank wall in the corrugation.

9. The subsea power module of claim 1, wherein the duct has an elastic portion configured to enable adaptation of the shape of the duct to the shape of the corrugation.

10. The subsea power module of claim 1, comprising a clamping structure provided with a resilient member configured to press the duct into the corrugation.

11. The subsea power module of claim 1, comprising a plurality of duct outlets arranged one after the other along the length of the duct in the corrugation.

12. The subsea power module of claim 1, wherein the duct has a longitudinal axis, and wherein the duct has a trapezoidal cross-sectional shape along the longitudinal axis.

13. The subsea power module of claim 1, wherein the duct has a vertical orientation in the tank and the duct inlet is arranged in a top portion of the duct.

14. The subsea power module of claim 1, wherein the power device is a power converter.

15. The subsea power module as claimed in claim 2, wherein the distancing structure is a mesh.

16. The subsea power module as claimed in claim 2, wherein the mesh is a metal mesh.

17. The subsea power module of claim 2, comprising an elastic sheet arranged between the duct and the tank wall in the corrugation.

18. The subsea power module of claim 2, comprising a clamping structure provided with a resilient member configured to press the duct into the corrugation.

19. The subsea power module as claimed in claim 4, wherein the mesh is a metal mesh.

* * * * *